United States Patent
Kabasawa et al.

(10) Patent No.: US 6,433,547 B2
(45) Date of Patent: Aug. 13, 2002

(54) METHOD OF DETERMINING THE DIRECTION OF APPLICATION OF GRADIENT MAGNETIC FIELD FOR THE DETECTION OF DIFFUSIVE MOTION, METHOD OF MEASURING THE DIFFUSION COEFFICIENT, AND MRI APPARATUS

(75) Inventors: Hiroyuki Kabasawa; Tetsuji Tsukamoto; Tsutomu Nakada, all of Tokyo (JP)

(73) Assignee: GE Medical Systems Global Technology Company, LLC, Waikesha, WI (US)

(*) Notice: Subject to any disclaimer, the term of this patent is extended or adjusted under 35 U.S.C. 154(b) by 0 days.

(21) Appl. No.: 09/748,814

(22) Filed: Dec. 22, 2000

(30) Foreign Application Priority Data

Dec. 27, 1999 (JP) .......................... 11-368824

(51) Int. Cl.[7] ............................... G01V 3/00
(52) U.S. Cl. .................. 324/314; 324/307; 324/309
(58) Field of Search ................... 329/314, 307, 329/309

(56) References Cited

U.S. PATENT DOCUMENTS

| | | | | |
|---|---|---|---|---|
| 5,406,947 A | * | 4/1995 | Kimura | 324/307 |
| 5,488,297 A | * | 1/1996 | Nakada | 324/309 |
| 5,539,310 A | * | 7/1996 | Basser et al. | 324/307 |
| 5,560,360 A | * | 10/1996 | Filler et al. | 324/307 |
| 5,684,400 A | * | 11/1997 | Tsukamoto et al. | 324/307 |
| 5,706,813 A | * | 1/1998 | Filler et al. | 324/318 |
| 5,969,524 A | * | 10/1999 | Pierpaoli et al. | 324/307 |

* cited by examiner

Primary Examiner—Edward Lefkowitz
Assistant Examiner—Dixomara Vargas
(74) Attorney, Agent, or Firm—Moonray Kojima

(57) ABSTRACT

For determining appropriately the direction of diffusive motion detecting gradient magnetic field to be applied for the measurement of the diffusion coefficient of a region of interest, a determining method produces three diffusion-weighted images by use of imaging pulse sequences which apply diffusive motion detecting gradient magnetic fields (MPG) along the x axis, y axis and z axis: (steps S1–S3). It composes an image from the diffusion-weighted images by allotting red color, green color and blue color to the images: (step S4). It sets a region of interest on the intensity-inverted image: (step S6). It determines the direction of diffusive motion detecting gradient magnetic field (MPG) to be applied for the measurement of the diffusion coefficient of the region of interest based on the hue of the region of interest on the intensity-inverted image: (step S7). It applies the diffusive motion detecting gradient magnetic field (MPG) in the determined direction to measure the diffusion coefficient of the volume of the region of interest by use of a diffusion coefficient measuring pulse sequence: (steps S8, S9).

20 Claims, 6 Drawing Sheets

METHOD OF DETERMINING THE DIRECTION OF APPLICATION OF GRADIENT MAGNETIC FIELD FOR THE DETECTION OF DIFFUSIVE MOTION, METHOD OF MEASURING THE DIFFUSION COEFFICIENT, AND MRI APPARATUS

BACKGROUND OF THE INVENTION

The present invention relates to a method of determining the direction of application of gradient magnetic field for the detection of diffusive motion, a method of measuring the diffusion coefficient, and an MRI (Magnetic Resonance Imaging) apparatus. More specifically, the present invention relates to a method of determining the direction of application of gradient magnetic field for the detection of diffusive motion, the method being capable of determining appropriately the direction of diffusive motion detecting gradient magnetic field to be applied for the measurement of the diffusion coefficient of nerve fibers, and a method of measuring the diffusion coefficient and an MRI apparatus, the method and apparatus being capable of measuring accurately the diffusion coefficient of nerve fibers.

The diffusion coefficient of nerve fibers is known to differ in value between the direction along the fiber direction and the direction orthogonal to the fiber direction.

Therefore, it is necessary for the measurement of the diffusion coefficient of nerve fibers to apply a gradient magnetic field for the diffusive motion detection in the direction along the fiber direction or the direction orthogonal to the fiber direction. Otherwise, a measured value, which is neither a diffusion coefficient in the direction along the fiber direction nor a diffusion coefficient in the direction orthogonal to the fiber direction, is meaningless.

On this account, conventionally, the doctor or technician has inferred the fiber direction of nerve fibers based on one's experience by viewing the ordinary MRI image (a monochrome display of the proton density image) and determined the direction of diffusive motion detecting gradient magnetic field to be applied in accordance with the inferred fiber direction.

However, it is problematic in that the fiber direction of nerve fibers cannot necessarily be inferred correctly from the MRI image.

SUMMARY OF THE INVENTION

It is an object of the present invention to provide a method of determining the direction of application of gradient magnetic field for the detection of diffusive motion, the method being capable of determining appropriately the direction of diffusive motion detecting gradient magnetic field (Motion Probing Gradient) to be applied for the measurement of the diffusion coefficient of nerve fibers, and a method of measuring the diffusion coefficient and an MRI apparatus, the method and apparatus being capable of measuring accurately the diffusion coefficient of nerve fibers.

At a first viewpoint, the present invention provides a method of determining the direction of application of gradient magnetic field for the detection of diffusive motion, the method being characterized by producing, by being based on data which is collected by sequential application of diffusive motion detecting gradient magnetic fields along at least two axes out of three orthogonal axes, at least two diffusion-weighted images which correspond to the application axes, composing an image from the diffusion-weighted images by allotting different display colors thereto, displaying the composed image or the intensity-inverted version thereof, and determining the direction of diffusive motion detecting gradient magnetic field to be applied for the measurement of the diffusion coefficient of a region of interest on the composed image or the intensity-inverted image based on the hue of the region of interest.

The diffusive motion detecting gradient magnetic field application direction determining method of the first viewpoint yields at least two diffusion-weighted images of different application axes, and due to the anisotropy of diffusion coefficient of nerve fibers, diffusion-weighted images of nerve fibers are displayed differently from each other. When an image is composed from the diffusion-weighted images, with different display colors being rendered thereto, the resulting nerve fiber image has hues which depend on the directions of fibers. Accordingly, it is possible to determine the direction of diffusive motion detecting gradient magnetic field to be applied for the measurement of the diffusion coefficient of a region of interest based on the hue of the region of interest.

At a second viewpoint, the present invention provides a method of determining the direction of application of gradient magnetic field for the detection of diffusive motion, the method being characterized by producing, by being based on data which is collected by sequential application of diffusive motion detecting gradient magnetic fields along three orthogonal axes, three diffusion-weighted images which correspond to the application axes, composing an image from the diffusion-weighted images by allotting different display colors thereto, displaying the composed image or the intensity-inverted version thereof, and determining the direction of diffusive motion detecting gradient magnetic field to be applied for the measurement of the diffusion coefficient of a region of interest on the composed image or the intensity-inverted image based on the hue of the region of interest.

The diffusive motion detecting gradient magnetic field application direction determining method of the second viewpoint yields three diffusion-weighted images of different application axes, and due to the anisotropy of diffusion coefficient of nerve fibers, diffusion-weighted images of nerve fibers are displayed differently from each other. When an image is composed from the diffusion-weighted images, with different display colors being rendered thereto, the resulting nerve fiber image has hues which depend on the directions of fibers. Accordingly, it is possible to determine the direction of diffusive motion detecting gradient magnetic field to be applied for the measurement of the diffusion coefficient of a region of interest based on the hue of the region of interest.

At a third viewpoint, the present invention provides a method of determining the direction of application of gradient magnetic field for the detection of diffusive motion, the method being derived from the diffusive motion detecting gradient magnetic field application direction determining methods of the foregoing viewpoints and characterized in that an operating person sets a region of interest by specifying a frame of region or a center point of a frame of region on the composed image or the intensity-inverted image.

The diffusive motion detecting gradient magnetic field application direction determining method of the third viewpoint enables easy setting of a region of interest by an operating person who specifies a frame of region or a center point of a frame of region on the composed image or the intensity-inverted image.

At a fourth viewpoint, the present invention provides a method of determining the direction of application of gradient magnetic field for the detection of diffusive motion, the method being derived from the diffusive motion detecting gradient magnetic field application direction determining methods of the foregoing viewpoints and characterized by determining the direction of application of gradient magnetic field for the detection of diffusive motion based on the relation between the hue of the region of interest in terms of an intensity vector (r,g,b) of t three primary colors of red, green and blue and the direction of diffusive motion detecting gradient magnetic field in terms of a directional vector (x,y,z):

$x=r/(r+g+b)$ $y=g/(r+g+b)$ $z=b/(r+g+b).$

The diffusive motion detecting gradient magnetic field application direction determining method of the fourth viewpoint enables easy evaluation of the directional vector indicative of the direction of diffusive motion detecting gradient magnetic field based on the intensity vector of the three primary colors.

At a fifth viewpoint, the present invention provides a method of measuring the diffusion coefficient of a region of interest by application of diffusive motion detecting gradient magnetic field in a direction which is determined based on the diffusive motion detecting gradient magnetic field application direction determining methods of the foregoing viewpoints.

The diffusion coefficient measuring method of the fifth viewpoint enables accurate measurement of the diffusion coefficient of a region of interest by application of diffusive motion detecting gradient magnetic field in the direction which is determined based on the diffusive motion detecting gradient magnetic field application direction determining methods of the foregoing viewpoints.

At a sixth viewpoint, the present invention provides an MRI apparatus characterized by comprising a diffusion-weighted image producing means which applies diffusive motion detecting gradient magnetic fields sequentially along at least two axes out of three orthogonal axes thereby to collect data and produces at least two diffusion-weighted images which correspond to the application axes, a composed image display means which composes an image from the diffusion-weighted images by allotting different display colors thereto and displays the composed image or the intensity-inverted version thereof, a diffusive motion detecting gradient magnetic field application direction determining means which determines the direction of diffusive motion detecting gradient magnetic field to be applied for the measurement of the diffusion coefficient of a region of interest on the composed image or the intensity-inverted image based on the hue of the region of interest, and a diffusion coefficient measuring means which measures the diffusion coefficient of the region of interest by application of diffusive motion detecting gradient magnetic field in the determined direction.

The MRI apparatus of the sixth viewpoint can carry out properly the diffusion coefficient measuring method of the fifth viewpoint.

At a seventh viewpoint, the present invention provides an MRI apparatus characterized by comprising a diffusion-weighted image producing means which applies diffusive motion detecting gradient magnetic fields sequentially along three orthogonal axes thereby to collect data and produces three diffusion-weighted images which correspond to the application axes, a composed image display means which composes an image from the diffusion-weighted images by allotting different display colors thereto and displays the composed image or the intensity-inverted version thereof, a diffusive motion detecting gradient magnetic field application direction determining means which determines the direction of diffusive motion detecting gradient magnetic field to be applied for the measurement of the diffusion coefficient of a region of interest on the composed image or the intensity-inverted image based on the hue of the region of interest, and a diffusion coefficient measuring means which measures the diffusion coefficient of the region of interest by application of diffusive motion detecting gradient magnetic field in the determined direction.

The MRI apparatus of the seventh viewpoint can carry out properly the diffusion coefficient measuring method of the fifth viewpoint.

At an eighth viewpoint, the present invention provides an MRI apparatus which is derived from the MRI apparatus of the foregoing viewpoints and characterized by further including a region setting means which sets a region of interest based on the operation by an operating person who specifies a frame of region or a center point of a frame of region on the composed image or the intensity-inverted image.

The MRI apparatus of the eighth viewpoint can readily set a region of interest based on the operation by an operating person who specifies a frame of region or a center point of a frame of region on the composed image or the intensity-inverted image.

At a ninth viewpoint, the present invention provides an MRI apparatus which is derived from the MRI apparatus of the foregoing viewpoints and characterized in that the diffusive motion detecting gradient magnetic field application direction determining means determines the direction of application of gradient magnetic field for the detection of diffusive motion based on the relation between the hue of the region of interest in terms of an intensity vector (r,g,b) oft three primary colors of red, green and blue and the direction of diffusive motion detecting gradient magnetic field in terms of a directional vector (x,y,z)

$x=r/(r+g+b)$ $y=g/(r+g+b)$ $z=b/(r+g+b).$

The MRI apparatus of the ninth viewpoint can readily evaluate the directional vector indicative of the direction of diffusive motion detecting gradient magnetic field based on the intensity vector of the three primary colors indicative of the hue.

According to the inventive method of determining the direction of application of diffusive motion detecting gradient magnetic field, it is possible to determine appropriately the direction of diffusive motion detecting gradient magnetic field to be applied for the measurement of diffusion coefficient.

According to the inventive diffusion coefficient measuring method and MRI apparatus, it is possible to measure accurately the diffusion coefficient of nerve fibers.

Further objects and advantages of the present invention will be apparent from the following description of the preferred embodiments of the invention as illustrated in the accompanying drawings.

DETAILED DESCRIPTION OF THE INVENTION

The present invention will be explained in more detail by dealing with the illustrated embodiments, which however do not confine the present invention.

First Embodiment

Figure 1:
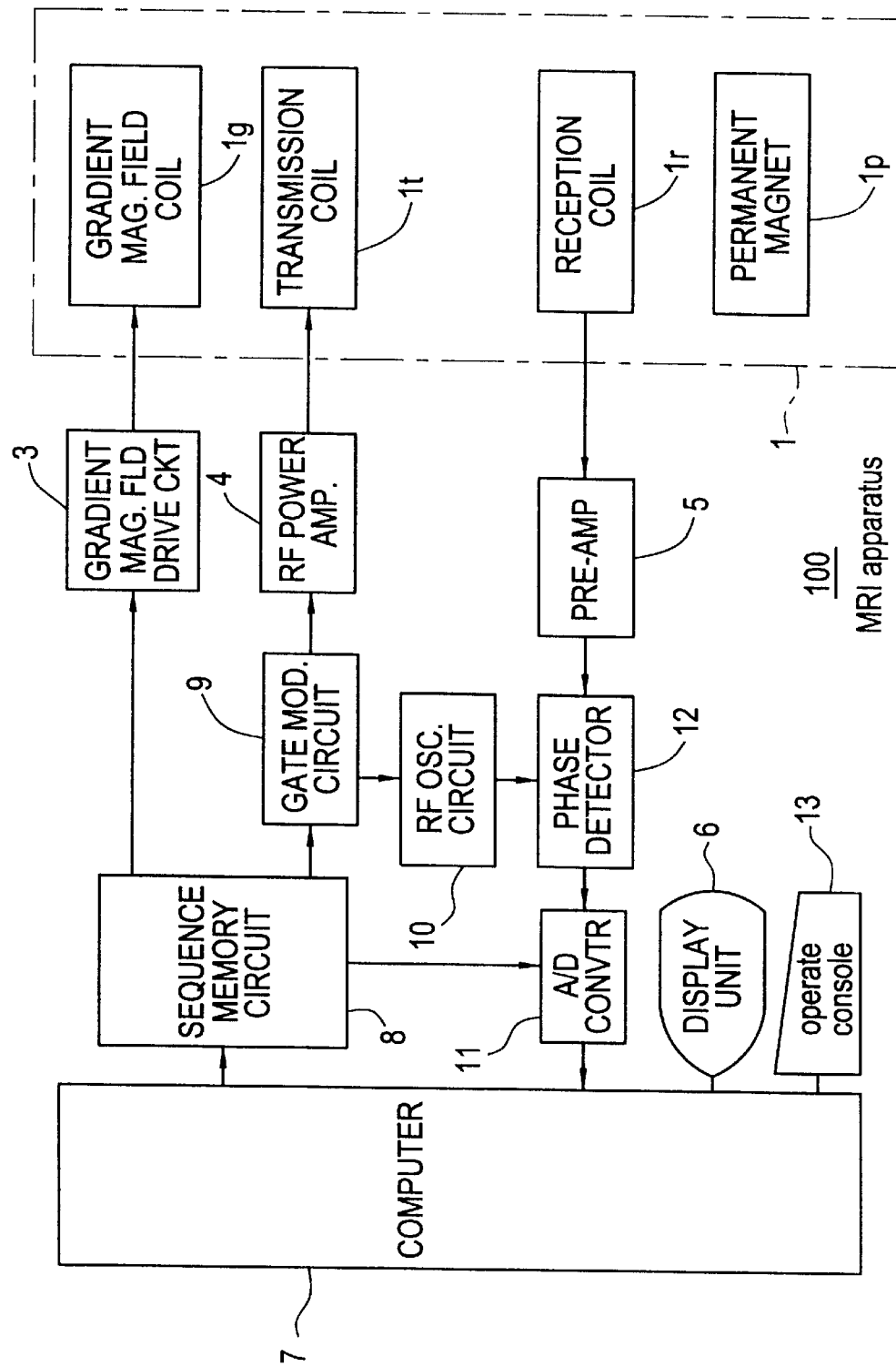
FIG. 1 is a block diagram showing the MRI apparatus based on the first embodiment of this invention.

FIG. 1 is a block diagram showing the MRI apparatus based on the first embodiment of this invention.

In this MRI apparatus 100, a magnet assembly 1 has a room section (bore) in which a subject of inspection is placed, and disposed around the room section are a permanent magnet 1p which applies a constant main magnetic field to the subject, a gradient magnetic field coil 1g for generating a gradient magnetic field of the x axis, y axis and z axis, a transmission coil 1t which produces an RF pulse for inducing the spin of atomic nucleus in the subject, and a reception coil 1r which detects the NMR signal from the subject. The gradient magnetic field coil 1g, transmission coil 1t and reception coil 1r are connected to a gradient magnetic field drive circuit 3, RF power amplifier 4 and pre-amplifier 5, respectively.

A sequence memory circuit 8, which operates in accordance with the commands from a computer 7 and based on the stored pulse sequence, operates on the gradient magnetic field drive circuit 3 so that the gradient magnetic field coil 1g of the magnet assembly 1 generates a gradient magnetic field, operates on a gate modulation circuit 9 to modulate the carrier output signal of an RF oscillation circuit 10 into a pulse signal having a certain timing and certain envelope, puts the resulting RF pulse in the RF power amplifier 4, and applies the amplified RF pulse to the transmission coil 1t of the magnet assembly 1 so that an intended slice region is excited selectively or an intended region of interest is excited selectively.

The pre-amplifier 5 amplifies the NMR signal from the subject detected by the reception coil 1r of the magnet assembly 1 and puts the amplified signal in a phase detector 12. The phase detector 12 implements the phase detection for the NMR signal from the pre-amplifier 5 based on the carrier output signal of the RF oscillation circuit 10 as a reference signal and puts the resulting signal in an A/D converter 11. The A/D converter 11 converts the analog phase-detected signal into a digital data and puts the data in the computer 7.

The computer 7 which receives the digital data from the A/D converter 11 implements the calculation of image reconstruction to produce an MRI image of the slice region and the calculation of diffusion coefficient of the region of interest. The computer 7 also implements general control including the entry of information from an operation console 13.

The resulting MRI image and diffusion coefficient of the region of interest are displayed on a display unit 6.

Figure 2:
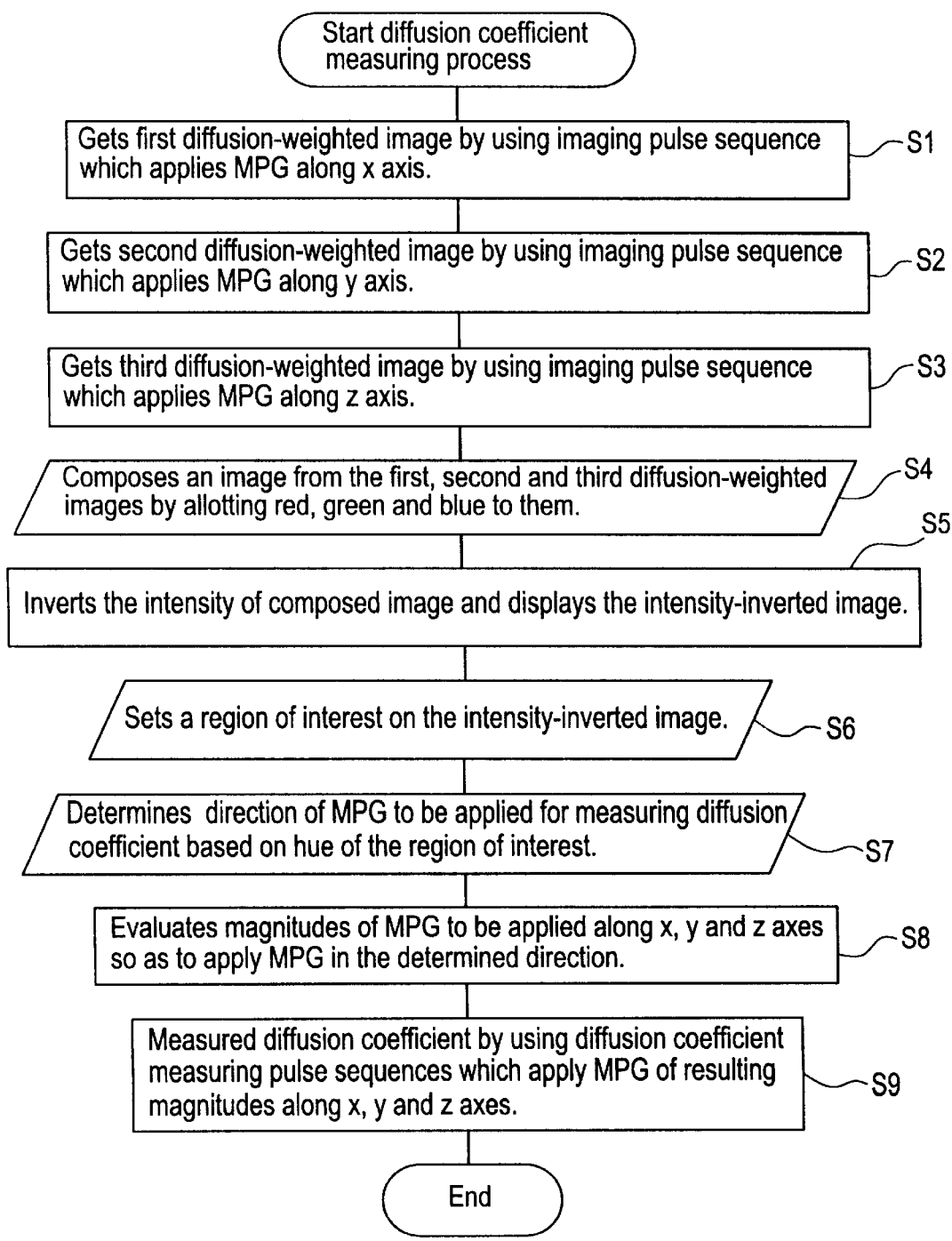
FIG. 2 is a flowchart showing the diffusion coefficient measuring process by the MRI apparatus of FIG. 1.

FIG. 2 is a flowchart showing the diffusion coefficient measuring process performed by the MRI apparatus 100.

Figure 3:
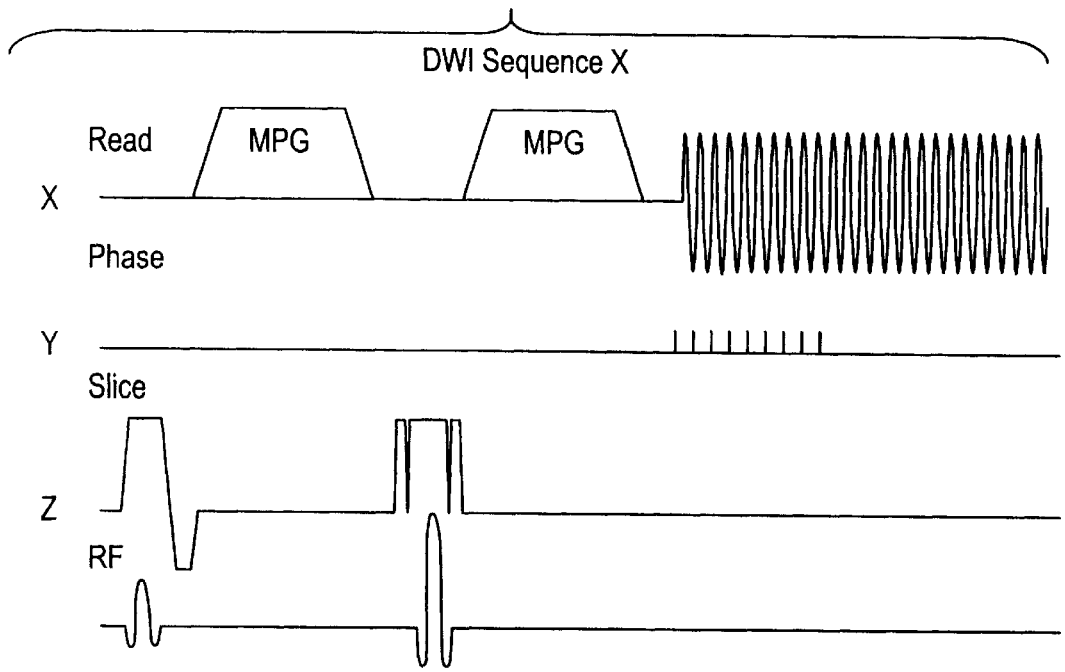
FIG. 3 is a pulse sequence diagram of the case of obtaining a diffusion-weighted image by application of MPG along the x axis.
Figures 6A, 6B, 6C:
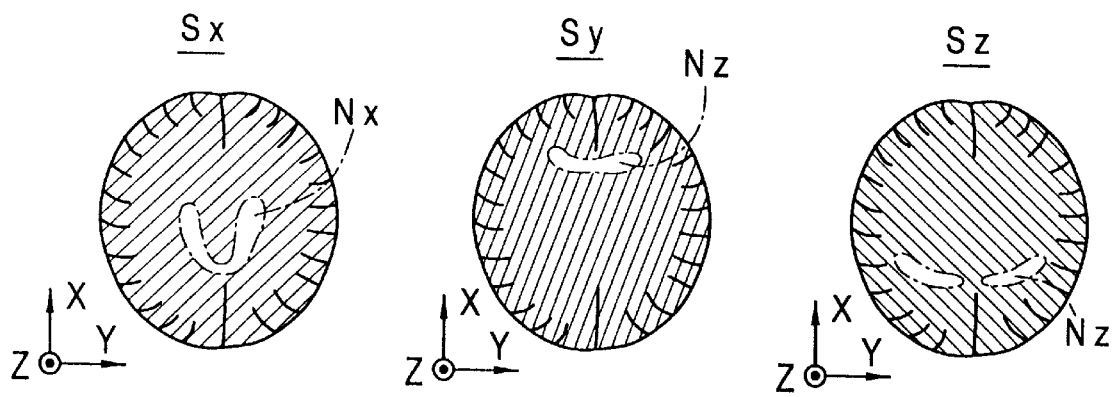
FIG. 6 is a diagram showing an example of the diffusion-weighted image which has been produced by sequential application of MPG along the x axis, y axis and z axis.

Step S1 collects the NMR signal by using an imaging pulse sequence which applies a diffusive motion detecting gradient magnetic field MPG as shown in FIG. 3 only to the x axis, thereby obtaining a first diffusion-weighted image Sx as shown by (a) in FIG. 6 (the image is emphasized for the expedience of explanation). This first diffusion-weighted image Sx is an axial image of the brain. The hatched area is a high-intensity region, and the white blank area enclosed by the dash-dot line is a low-intensity region. The low-intensity region indicates nerve fibers Nx having a fiber direction along the x axis which is the direction of application of the diffusive motion detecting gradient magnetic field.

Figure 4:
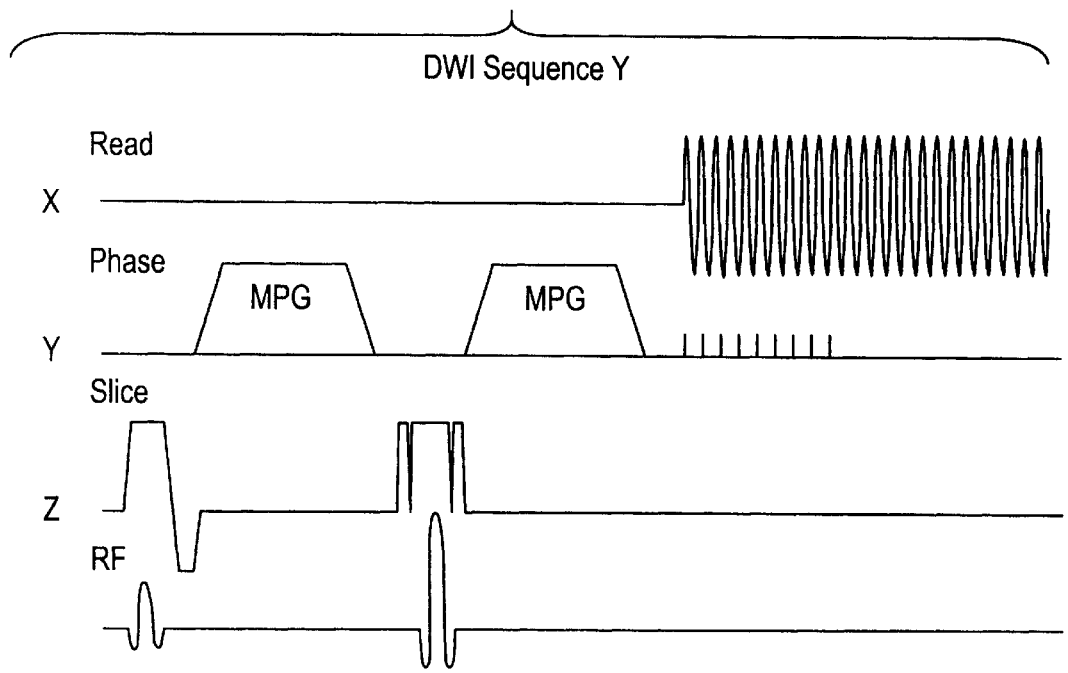
FIG. 4 is a pulse sequence diagram of the case of obtaining a diffusion-weighted image by application of MPG along the y axis.

Step S2 collects the NMR signal by using the same imaging pulse sequence as of the step S1, which in this case applies a diffusive motion detecting gradient magnetic field MPG as shown in FIG. 4 only to the y axis, thereby obtaining a second diffusion-weighted image Sy as shown by (b) in FIG. 6 (the image is emphasized for the expedience of explanation). This second diffusion-weighted image Sy is an axial image of the same brain as the step S1. The hatched area is a high-intensity region, and the white blank area enclosed by the dash-dot line is a low-intensity region. The low-intensity region indicates nerve fibers Ny having a fiber direction along the y axis which is the direction of application of the diffusive motion detecting gradient magnetic field.

Figure 5:
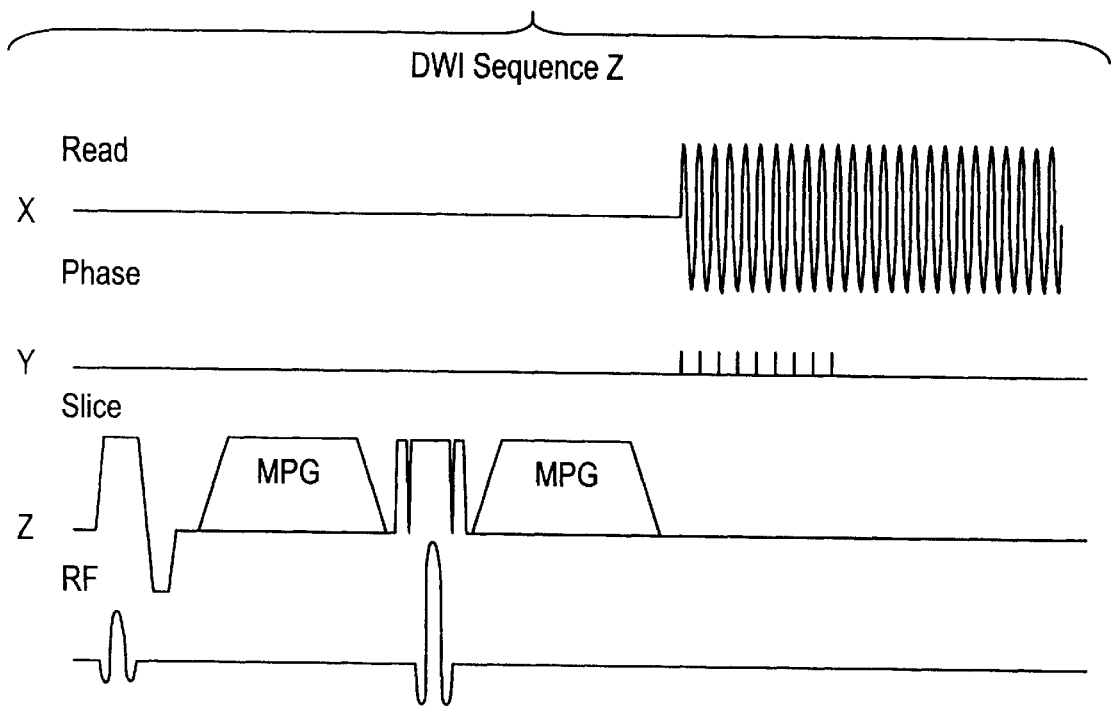
FIG. 5 is a pulse sequence diagram of the case of obtaining a diffusion-weighted image by application of MPG along the z axis.

Step S3 collects the NMR signal by using the same imaging pulse sequence as of the step S1, which in this case applies a diffusive motion detecting gradient magnetic field MPG as shown in FIG. 5 only to the z axis, thereby obtaining a third diffusion-weighted image Sz as shown by (c) in FIG. 6 (the image is emphasized for the expedience of explanation) . This third diffusion-weighted image Sz is an axial image of the same brain as the step S1. The hatched area is a high-intensity region, and the white blank area enclosed by the dash-dot line is a low-intensity region. The low-intensity region indicates nerve fibers Nz having a fiber direction along the z axis which is the direction of application of the diffusive motion detecting gradient magnetic field.

Figure 7:
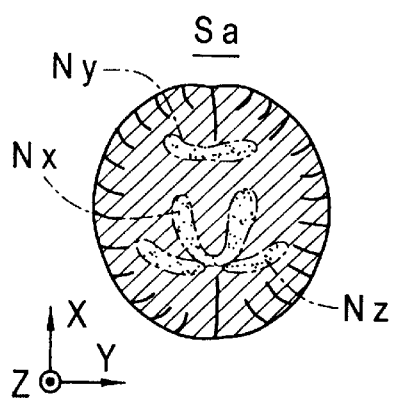
FIG. 7 is a diagram showing an example of the composed image which has been composed by allotment of the three primary colors to the diffusion-weighted images of FIG. 6.

Step S4 composes an image from the first, second and third diffusion-weighted images Sx, Sy and Sz by allotting red, green and blue colors to the respective images, thereby producing a composed image Sa as shown in FIG. 7. In this composed image Sa, the high-intensity region common to the diffusion-weighted images Sx, Sy and Sz is seen in white color. The nerve fibers Nx having a fiber direction along the x axis is seen in blue-green color (summed mixture of green color and blue color). The nerve fibers Ny having a fiber direction along the y axis is seen in red-purple color (summed mixture of red color and blue color) The nerve fibers Nz having a fiber direction along the z axis is seen in yellow color (summed mixture of red color and green color).

Figure 8:
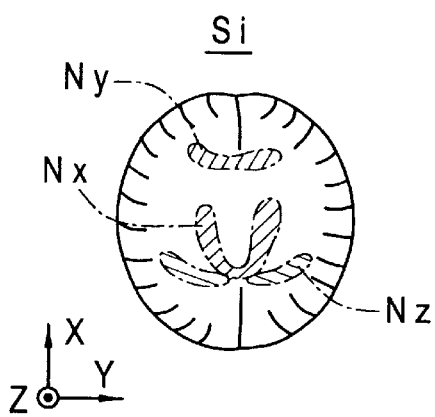
FIG. 8 is a diagram showing an example of the intensity-inverted image which is an intensity-inverted version of the composed image of FIG. 7.

Step S5 inverts the intensity of the composed image Sa to produce an intensity-inverted image Si as shown in FIG. 8, and displays it. In this intensity-inverted image Si, the high-intensity region common to the diffusion-weighted images Sx, Sy and Sz is seen in gray color. The nerve fibers Nx having a fiber direction along the x axis is seen in red color. The nerve fibers Ny having a fiber direction along the y axis is seen in green color. The nerve fibers Nz having a fiber direction along the z axis is seen in blue color.

Figure 9:
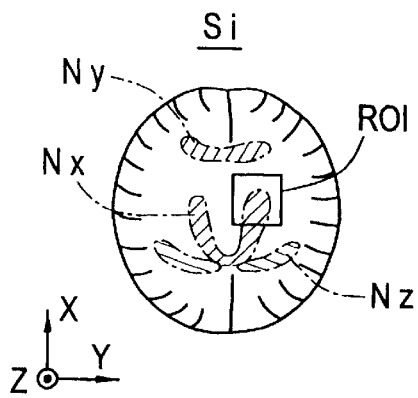
FIG. 9 is an explanatory diagram showing the specification of a region of interest on the intensity-inverted image of FIG. 8.
Figure 10A:
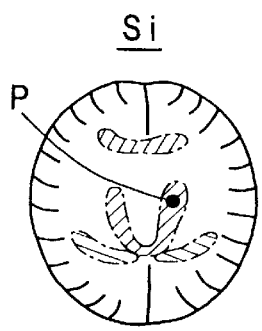
FIG. 10 is an explanatory diagram showing another manner of setting a region of interest.
Figure 10B:
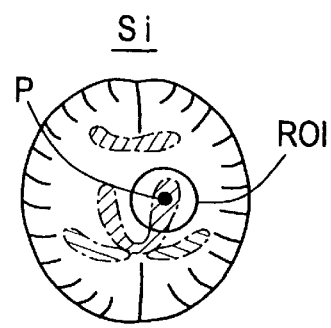

Step S6 lets the operator specify a region of interest (ROI) on the intensity-inverted image Si as shown in FIG. 9 or shown by (a) in FIG. 10. The manner of specification is either the entry of a frame of region as shown in FIG. 9 or the entry of a center point P as shown by (a) in FIG. 10. In the case of the entry of a center point P shown by (a) in FIG. 10, a frame of region having a predetermined shape (circle, rectangle, ellipsoid, etc.) centered by the center point P is formed automatically.

Step S7 determines the direction of diffusive motion detecting gradient magnetic field to be applied for the measurement of the diffusion coefficient of the region of interest (ROI) based on the hue of the region of interest (ROI) on the intensity-inverted image Si. The direction of diffusive motion detecting gradient magnetic field can be determined based on the relation between the hue of the region of interest in terms of an intensity vector (r,g,b) of the three primary colors of red, green and blue and the diffusive motion detecting gradient magnetic field direction in terms of a directional vector (x,y,z) as follows:

$x=r/(r+g+b)$ $y=g/(r+g+b)$ $z=b/(r+g+b)$.

In the example of FIG. 9 or FIG. 10, the intensity vector has values of (r,g,b)=(1,0,0), and accordingly the directional vector has values D(x,y,z)=(1,0,0). This means that the direction D of diffusive mot detecting gradient magnetic field to be applied for obtaining the diffusion coefficient of the region of interest (ROI) is the x-axis direction.

Step S8 evaluates the magnitudes of diffusive motion detecting gradient magnetic field to be applied along the x axis, y axis and z axis for the application of diffusive motion detecting gradient magnetic field along the determined direction D(x,y,z). The magnitudes of diffusive motion detecting gradient magnetic field have the ratio of the values of x, y and z.

Figure 11:
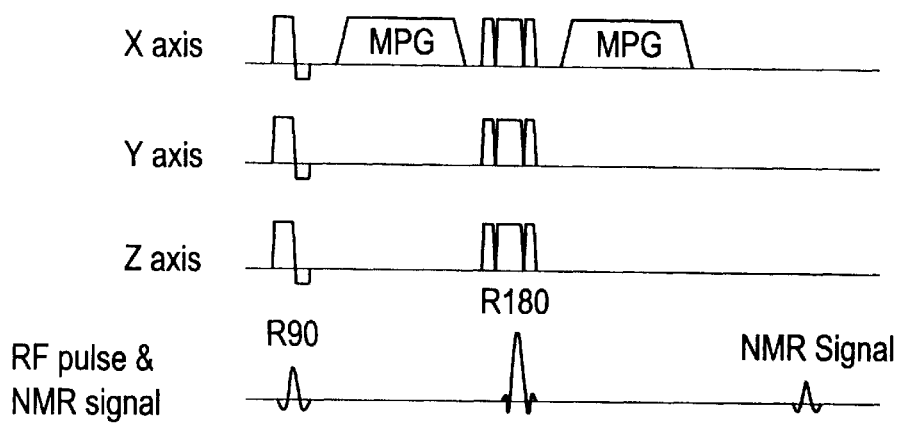
FIG. 11 is a pulse sequence diagram of the case of measuring the diffusion coefficient of a region of interest by application of MPG along the x axis.

Step S9 applies the diffusive motion detecting gradient magnetic fields of the obtained magnitudes along the x axis, y axis and z axis, and measures the diffusion coefficient of the volume which is determined from the region of interest (ROI) and the thickness of slicing by using the diffusion coefficient measuring pulse sequence. In the example of the region of interest (ROI) of FIG. 9 or FIG. 10, in which D(x,y,z)=(1,0), only the volume of region of interest (ROI) is excited and inverted, with the diffusive motion detecting gradient magnetic field MPG being applied only along the x axis as shown by the diffusion coefficient measuring pulse sequence A in FIG. 11.

The MRI apparatus 100 is capable of determining appropriately the direction of diffusive motion detecting gradient magnetic field to be applied for the measurement of the diffusion coefficient of the region of interest (ROI), and consequently it becomes possible to measure the diffusion coefficient of nerve fibers accurately.

Other Embodiment

The direction of diffusive motion detecting gradient magnetic field to be applied for the measurement of the diffusion coefficient of the region of interest (ROI) may be determined by the judgment of the doctor or technician based on the hue of the region of interest (ROI) on the composed image Sa or intensity-inverted image Si. Even in this case, the application direction of diffusive motion detecting gradient magnetic field can be determined more appropriately than the conventional scheme.

Although the foregoing embodiment uses three orthogonal axes on assumption that nerves run in a three-dimensional fashion, if nerves can be assumed to run in a two-dimensional fashion, the present invention can be implemented for two orthogonal axes of a two-dimensional space in a similar manner to the foregoing embodiment.

Many widely different embodiments of the invention may be configured without departing from the spirit and the scope of the present invention. It should be understood that the present invention is not limited to the specific embodiments described in the specification, except as defined in the appended claims.

What is claimed is:

1. A method of determining direction of application of gradient magnetic field for detection of diffusive motion, comprising the steps of:

sequentially applying gradient magnetic fields along at least two orthogonal axes to collect data;

producing at least two diffusion weighted images which correspond to said at least two application axes;

composing a composed image from said at least two diffusion weighted images by allocating different display colors thereto or inverting intensity of said composed image;

displaying said composed image or said intensity inverted image;

selecting a region of interest on said composed image or said intensity inverted image;

obtaining hue of said region of interest; and determining direction of gradient magnetic field to be applied for measurement of diffusion coefficient of said region of interest based on said hue obtained of said region of interest.

2. The method of claim 1, wherein said gradient magnetic fields are applied along three orthogonal axes, and wherein three diffusion weighted images are obtained corresponding to said three application axes.

3. The method of claim 1, wherein said region of interest is selected by specifying a frame of a region or a center point of a frame of a region on said composed image or said intensity inverted image.

4. The method of claim 2, wherein said region of interest is selected by specifying a frame of a region or a center point of a frame of a region on said composed image or said intensity inverted image.

5. The method of claim 2, wherein said hue of said region of interest is expressed in terms of an intensity vector (r,g,b) of three primary colors, and wherein said direction is expressed in terms of direction vectors (x,y,z), wherein x=r/(r+g+b); y=g/(r+g+b); and z=b/(r+g+b).

6. A method of measuring diffusion coefficient of a region of interest comprising the steps of:
- sequentially applying gradient magnetic fields along at least two orthogonal axes to collect data;
- producing at least two diffusion weighted images which correspond to said at least two application axes;
- composing a composed image from said at least two diffusion weighted images by allocating different display colors thereto or inverting intensity of said composed image;
- displaying said composed image or said intensity inverted image;
- selecting a region of interest on said composed image or said intensity inverted image;
- obtaining hue of said region of interest;
- determining direction of gradient magnetic field to be applied for measurement of diffusion coefficient of said region of interest based on said hue obtained of said region of interest;
- evaluating magnitudes of said gradient magnetic fields to be applied to said axes so as to apply said gradient magnetic fields in said direction determined in the prior step; and
- measuring diffusion coefficient by using diffusion coefficient measuring pulse sequences which apply gradient magnetic fields of magnitudes obtained in the prior step along said axes.

7. The method of claim 6, wherein said gradient magnetic fields are applied along three orthogonal axes, and wherein three diffusion weighted images are obtained corresponding to said three application axes.

8. The method of claim 6, wherein said region of interest is selected by specifying a frame of a region or a center point of a frame of a region on said composed image or said intensity inverted image.

9. The method of claim 7, wherein said region of interest is selected by specifying a frame of a region or a center pont of a frame of a region on said composed image or said intensity inverted image.

10. The method of claim 7, wherein said hue of said region of interest is expressed in terms of an intensity vector (r,g,b) of three primary colors, and wherein said direction is expressed in terms of direction vectors (x,y,z), wherein x=r/(r+g+b); y=g/(r+g+b); and z=b/(r+g+b).

11. An MRI apparatus comprising:
- means for sequentially applying gradient magnetic fields along at least two orthogonal axes to collect data;
- means for producing at least two diffusion weighted images which correspond to said at least two application axes;
- means for composing a composed image from said at least two diffusion weighted images by allocating different display colors thereto or inverting intensity of said composed image;
- means for displaying said composed image or said intensity inverted image;
- means for selecting a region of interest on said composed image or said intensity inverted image;
- means for obtaining hue of said region of interest; and
- means for determining direction of gradient magnetic field to be applied for measurement of diffusion coefficient of said region of interest based on said hue obtained of said region of interest.

12. The apparatus of claim 11, wherein said means for sequentially applying comprises means for sequentially applying gradient magnetic fields along three orthogonal axes; and wherein said means for producing comprises means for producing three diffusion weighted images corresponding to said three application axes.

13. The apparatus of claim 11, wherein said means for selecting comprises means for selecting said region of interest by specifying a frame of a region or a center point of a frame of a region on said composed image or said intensity inverted image.

14. The apparatus of claim 12, wherein said means for selecting comprises means for selecting said region of interest by specifying a frame of a region or a center point of a frame of a region on said composed image or said intensity inverted image.

15. The apparatus of claim 12, wherein said means for obtaining comprises means for obtaining said hue of said region expressed in terms of an intensity vector (r,g,b) of three primary colors, and wherein said means for determining comprises means for determining direction as expressed in terms of direction vectors (x,y,z), wherein x=r/(r+g+b); y=g/(r+g+b); and z=b/(r+g+b).

16. An MRI apparatus comprising:
- means for sequentially applying gradient magnetic fields along at least two orthogonal axes to collect data;
- means for producing at least two diffusion weighted images which correspond to said at least two application axes;
- means for composing a composed image from said at least two diffusion weighted images by allocating different display colors thereto or inverting intensity of said composed image;
- means for displaying said composed image or said intensity inverted image;
- means for selecting a region of interest on said composed image or said intensity inverted image;
- means for obtaining hue of said region of interest;
- means for determining direction of gradient magnetic field to be applied for measurement of diffusion coefficient of said region of interest based on said hue obtained of said region of interest;
- means for evaluating magnitudes of said gradient magnetic fields to be applied to said axes so as to apply said gradient magnetic fields in said direction determined by said prior means; and
- means for measuring diffusion coefficient by using diffusion coefficient measuring pulse sequences which apply gradient magnetic fields of magnitudes obtained by the prior means along said axes.

17. The apparatus of claim 16, wherein said means for sequentially applying comprises means for sequentially applying gradient magnetic fields along three orthogonal axes; and wherein said means for producing comprises means for producing three diffusion weighted images corresponding to said three application axes.

18. The apparatus of claim 16, wherein said means for selecting comprises means for selecting said region of interest by specifying a frame of a region or a center point of a frame of a region on said composed image or said intensity inverted image.

19. The apparatus of claim 17, wherein said means for selecting comprises means for selecting said region of interest by specifying a frame of a region or a center point of a frame of a region on said composed image or said intensity inverted image.

20. The apparatus of claim 16, wherein said means for obtaining comprises means for obtaining said hue of said region expressed in terms of an intensity sector (r,g,b) of three primary colors, and wherein said means for determining comprises means for determining direction as expressed in terms of direction vectors (x,y,z), wherein x=r/(r+g+b); y=g/(r+g+b); and z=b/(r+g+b).

* * * * *